United States Patent
Della Fiora et al.

(10) Patent No.: US 9,854,698 B2
(45) Date of Patent: Dec. 26, 2017

(54) SUPPORT MEMBER

(71) Applicant: HEWLETT PACKARD ENTERPRISE DEVELOPMENT LP, Houston, TX (US)

(72) Inventors: Troy Anthony Della Fiora, Spring, TX (US); James Jeffery Schulze, Houston, TX (US); Dave Preston, Houston, TX (US); Joseph Allen, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/314,937

(22) PCT Filed: Jun. 20, 2014

(86) PCT No.: PCT/US2014/043486
§ 371 (c)(1),
(2) Date: Nov. 29, 2016

(87) PCT Pub. No.: WO2015/195144
PCT Pub. Date: Dec. 23, 2015

(65) Prior Publication Data
US 2017/0202102 A1    Jul. 13, 2017

(51) Int. Cl.
*H05K 7/14*    (2006.01)
*H05K 5/02*    (2006.01)
(Continued)

(52) U.S. Cl.
CPC ........... *H05K 7/1489* (2013.01); *G06F 1/189* (2013.01); *H05K 5/0017* (2013.01); *H05K 5/023* (2013.01);
(Continued)

(58) Field of Classification Search
CPC ...... H05K 7/1489; H05K 7/1491; H05K 7/14; H05K 5/0221; H05K 5/023; G06F 1/189
(Continued)

(56) References Cited

U.S. PATENT DOCUMENTS 4,426,122 A    1/1984 Lainez et al.
4,780,792 A    10/1988 Harris
(Continued)

FOREIGN PATENT DOCUMENTS

WO    WO-2015122898    8/2015

OTHER PUBLICATIONS

GrassValley.Com; FT Server Fault Tolerant Server Platform; Sep. 2012, 96 pps. http://www.grassvalley.com/docs/Manuals/servers/stratus/071-8852-01_FTserver_INSTR.pdf>.
(Continued)

*Primary Examiner* — Dion R Ferguson
*Assistant Examiner* — Mandeep S Buttar
(74) *Attorney, Agent, or Firm* — Hewlett Packard Enterprise Patent Department (57) ABSTRACT

An example module is provided herein. The module includes a tray and a cable support member. The tray includes a cage, a handle mechanism, a tray handle, and a tray midplane. The cage receives an electronic component and the handle mechanism rotates the cage using a cage lever and a cam member between a closed position, a top open position, and a bottom open position. The tray handle releases the tray from an engaged position. The tray midplane provides a connector for the electronic component. The cable support member provides a movable connection between the tray midplane and an enclosure backplane.

15 Claims, 8 Drawing Sheets

(51) Int. Cl.
*H05K 5/00* (2006.01)
*G06F 1/18* (2006.01)

(52) U.S. Cl.
CPC ......... *H05K 5/0221* (2013.01); *H05K 7/1491* (2013.01)

(58) Field of Classification Search
USPC .......... 361/724, 747, 679.37, 737; 439/157; 312/333, 301, 302
See application file for complete search history.

(56) References Cited

U.S. PATENT DOCUMENTS

| | | | |
|---|---|---|---|
| 4,850,485 A | 7/1989 | Ishikawa | |
| 5,537,268 A | 7/1996 | Felde et al. | |
| 5,912,799 A | 6/1999 | Grouell et al. | |
| 5,949,652 A | 9/1999 | McAnally | |
| 6,134,115 A | 10/2000 | Sim | |
| 6,392,884 B1 | 5/2002 | Chou | |
| 6,600,703 B1 | 7/2003 | Emberty et al. | |
| 7,029,306 B2 | 4/2006 | Bilcauu et al. | |
| 7,200,008 B1 | 4/2007 | Bhugra | |
| 7,362,565 B2 | 4/2008 | Imblum | |
| 7,400,469 B2 | 7/2008 | Starr et al. | |
| 7,400,936 B2 | 7/2008 | Chang | |
| 7,633,748 B2 | 12/2009 | Carlson et al. | |
| 8,009,385 B2 | 8/2011 | Starr et al. | |
| 9,115,515 B1 * | 8/2015 | South ...................... | E05B 77/54 |
| 9,699,931 B1 * | 7/2017 | Chen .................... | H05K 7/1489 |
| 2003/0002261 A1 | 1/2003 | Berry | |
| 2004/0047128 A1 | 3/2004 | McClelland | |
| 2006/0171110 A1 | 8/2006 | Li | |
| 2008/0030946 A1 | 2/2008 | Lee | |
| 2011/0114808 A1 | 5/2011 | Huang et al. | |
| 2011/0176270 A1 | 7/2011 | Chou et al. | |
| 2012/0145877 A1 | 6/2012 | Chiu | |
| 2013/0070422 A1 * | 3/2013 | Dunham ................. | G06F 1/187 |
| | | | 361/725 |
| 2013/0335913 A1 | 12/2013 | Brashers et al. | |
| 2013/0342990 A1 | 12/2013 | Jau | |
| 2014/0055959 A1 | 2/2014 | Manda | |
| 2014/0307400 A1 | 10/2014 | French, Jr. | |
| 2014/0362515 A1 | 12/2014 | Pronozuk et al. | |
| 2015/0327414 A1 | 11/2015 | Jau et al. | |

OTHER PUBLICATIONS

PCT/ISA/KR, International Search Report, dated Nov. 12, 2014, PCT/US2014/016321.
PCT/ISA/KR International Search Report, dated Feb. 26, 2015, PCT/US2014/043486.

* cited by examiner

SUPPORT MEMBER

CROSS REFERENCE TO RELATED APPLICATIONS

This application is related to commonly-owned patent application serial no. PCT/US2014/016321, entitled "HANDLE MECHANISM" filed Feb. 14, 2014 by Troy Anthony Della Fiora et al., which the related application is incorporated herein by reference in its entirety.

BACKGROUND

Computing systems include electronic components. The electronic components are combined to form the system. The arrangement of the electronic components in a rack depends on the type of electronic components used and the space constraints of the rack and/or location of the rack.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale, Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing system designs determine requirements for components in the computing system. Space, thermal constraints, cost, and ease of use are some factors that determine the tray design. The type of support members used to store and access the components may be designed for use with specific components and trays.

In examples, a module is provided. The module includes a tray, a tray handle, a tray midplane, and a cable support member. The tray includes a cage, a handle mechanism, a tray, handle, and a tray midplane. The cage to receive an electronic component, and the handle mechanism to rotate the cage. The handle mechanism includes a cage lever and a cam member. The cage lever to rotate between a closed position, a top open position, and a bottom open position. The cam member to control a rate of rotation of the cage lever and the cage. The tray handle is connected to the tray to release the tray from an engaged position. The tray midplane to provide a connector for the electronic component. The cable support member to provide a movable connection between the tray midplane and an enclosure backplane. The handle mechanism provides access to the cage via two directions, such as top access above a tray of electronic components and bottom access below a tray of electronic components.

The phrase "electronic component" refers to a computing device such as a server, blade server, server cartridge that provides computer solutions, storage solutions, network solutions and/or cloud services.

Figure 1:
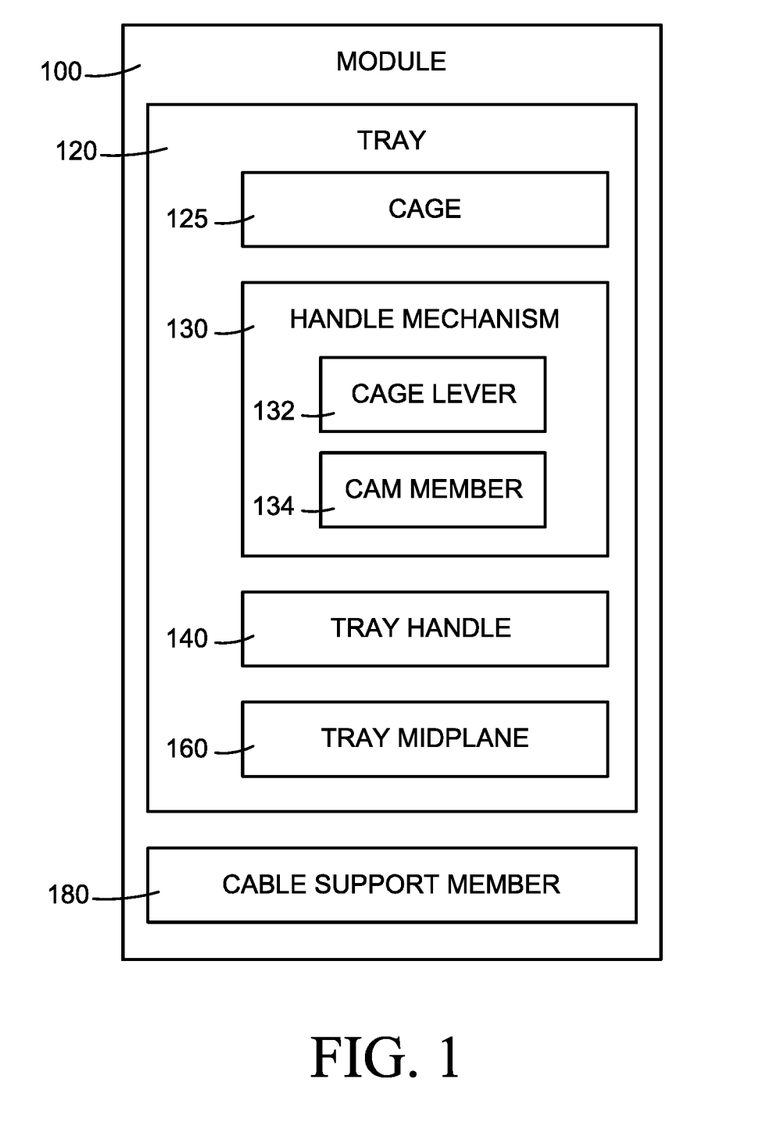
FIG. 1 illustrates a block diagram of a module according to an example.

FIG. 1 illustrates a block diagram of a module 100 according to an example. The module 100 includes a tray 120 and a cable support member 180. The tray 120 includes a cage 125, a handle mechanism 130, a tray handle 140, and a tray midplane 160. The cage 125 to receive an electronic component. The handle mechanism 130 to rotate the cage 125. The handle mechanism 130 includes a cage lever 132 to rotate between a closed position, a top open position, and a bottom open position, and a cam member 134 to control a rate of rotation of the cage lever 132 and the cage 125. The tray handle 140 is connected to the tray 120 to release the tray 120 from an engaged position. The tray midplane 160 to provide a connector for the electronic component. The cable support member 180 to provide a movable connection between the tray midplane and an enclosure backplane.

Figure 2:
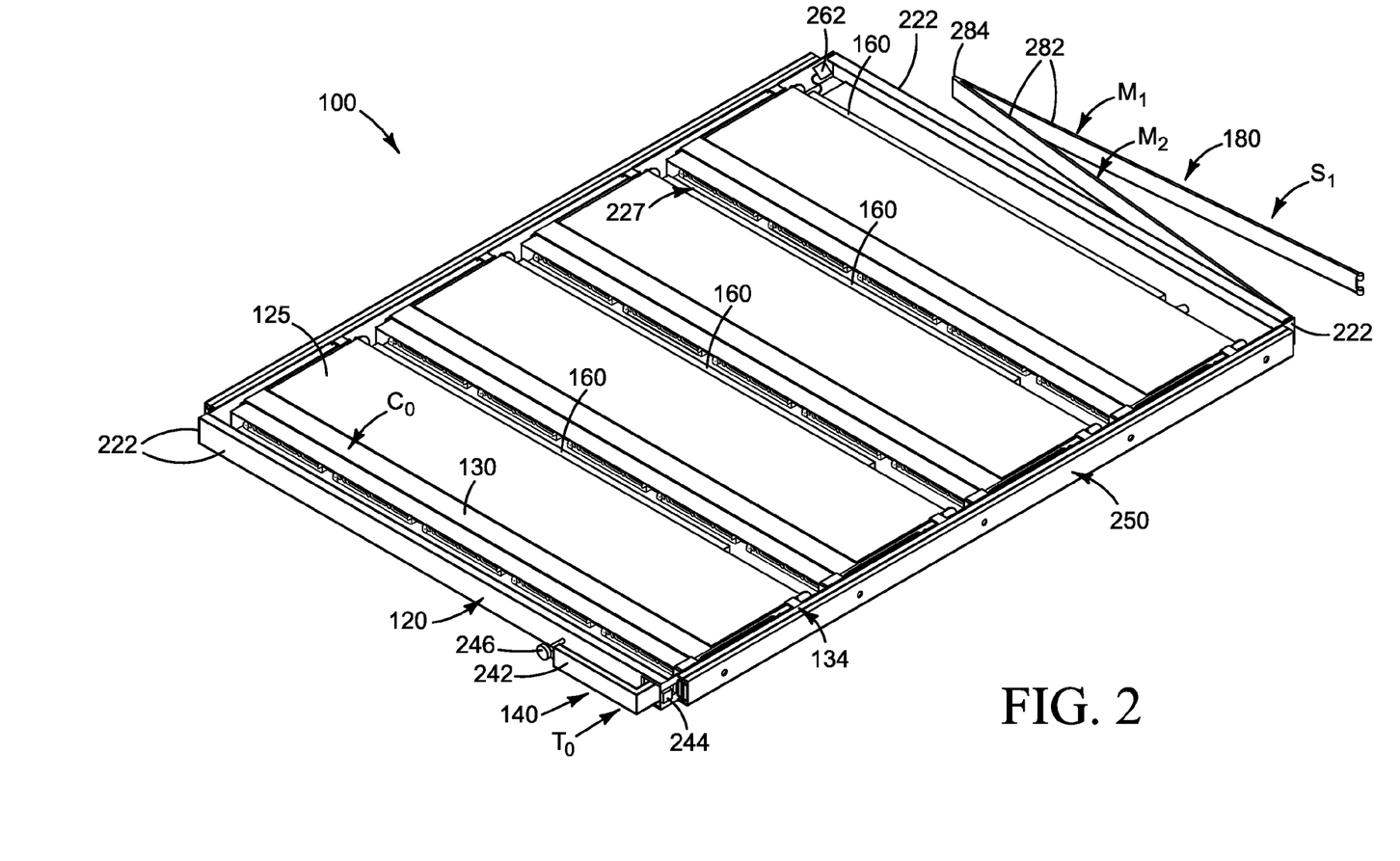
FIGS. 2-4 illustrate perspective views of the module of FIG. 1 according to an example.
Figure 3:
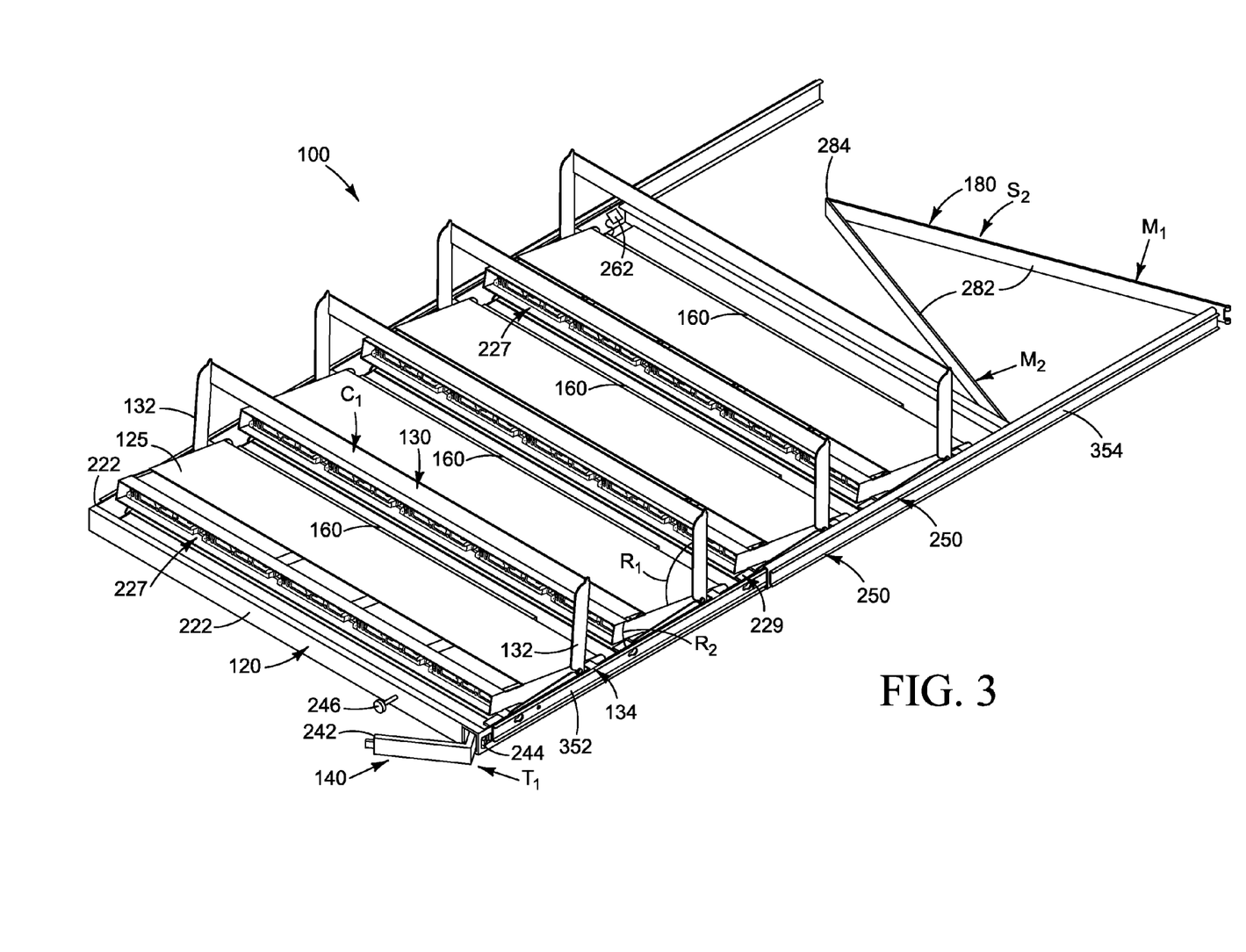
Figure 4:
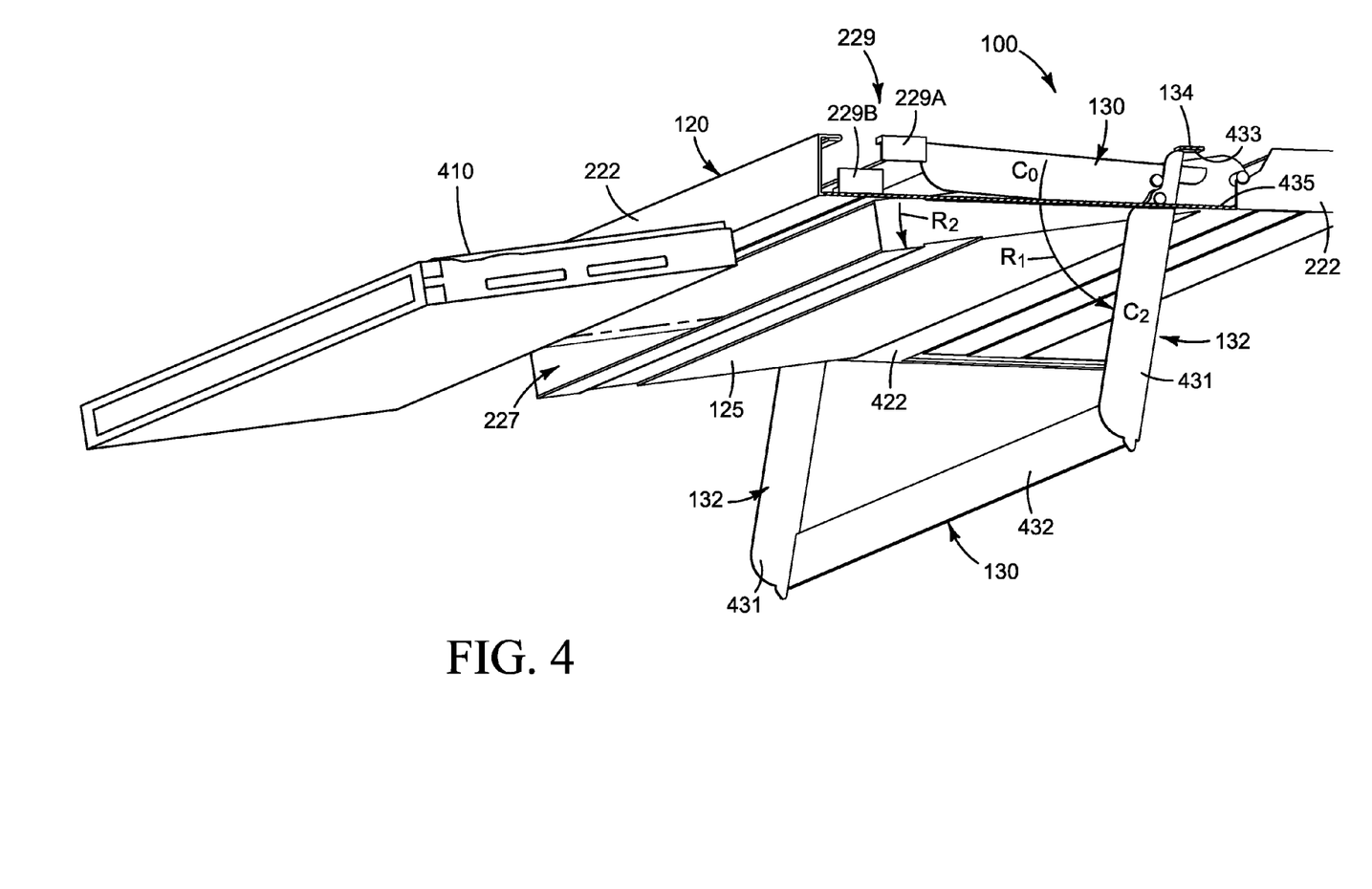

FIGS. 2-4 illustrate perspective views of the module 100 of FIG. 1 according to an example. Referring to FIGS. 2-3 the module 100 includes the tray 120, the tray handle 140, the tray midplane 160, and a cable support member 180. The tray 120 illustrated includes four perimeter walls 222 and a cage 125 that receives an electronic component. The cage 125 is illustrated as four cages for use in a 4U tray assembly. Each cage is illustrated as having slots 227 for five electronic components. The handle mechanism 130 is connected to the cage 125 to control access to the cage 125. Referring to FIG. 3, the handle mechanism 130 includes a cage lever 132 to control the access. For example, in a top open position $C_1$, the cage lever 132 rotates a first amount $R_1$ to the top open position $C_1$. Rotation of the cage lever 132 rotates the cage 125 a second amount $R_2$ to provide access to the cage 125 and/or electronic components therein. The handle mechanism 130 may further include a cam member 134 to rotate the first amount $R_1$ along a first plane and the second amount $R_2$ along a second plane such that the first amount $R_1$ and the second amount $R_2$ are distinct.

The handle mechanism 130 may extend across one cage 125 or a plurality of cages 125. The configuration depends on the configuration of the tray 120 and/or electronic components. The handle mechanism 130 is illustrated in a closed position $C_0$ in FIG. 2, and in a top open position $C_1$ in FIG. 3. A latch or a retaining cage mechanism 229 may engage with the handle mechanism 130 to hold to the handle mechanism 130 in the closed position $C_0$. Moreover, the latch or cage retaining mechanism 229 may release the handle mechanism 130 to enable the cage lever 132 to move between the closed position $C_0$ (FIG. 2) and the top open position $C_1$ (FIG. 3) and the bottom open position $C_2$ (FIG. 4).

The module 100 is further illustrated to include a rail member 250 that connects to the tray 120, i.e., two opposing perimeter walls 222, such as two side walls. For example, the rail member 250 may slide into and out of a rack using ball bearings. FIG. 2 illustrates the rail member 250 as it would appear when it is inserted into the rack. FIG. 3 illustrates the rail member 250 extended, as it would appear when the tray 120 is removed from the rack for access or service. The rail member 250 is illustrated as having two rails, a first rail 352 and a second rail 354. For example, the second rail 354 may be a fixed rail and the first rail 352 may be a slideably attached to the fixed rail 354.

The tray midplane 160 is connected to the cage 125 along a back end. The tray midplane 160 may include hot pluggable connections or ports, such as a dual domain SAS (Serial Attached SCSI) port, to connect to electronic components inserted into the cage 125. The tray midplane 160 may also include a printed circuit assembly 262 formed along the tray 120 to connect to the enclosure backplane via a cable. The tray midplane 160 may connect to an enclosure backplane and/or other control devices through cables that may be connected to each tray midplane 160 via pathways along the perimeter 222 of the tray 120.

The tray handle 140 is connected to one of the perimeter walls 222 of the tray 120, illustrated as the front wall to allow access to the tray handle 140 when the tray 120 is inserted into a rack. The tray handle 140 may include, for example, a lever member 242 and an engagement member 244, such as a hook, that moves into and out of engagement with a rack based on the movement of the lever member 242. The tray handle 140 may also engage with a retaining member or lock to hold the tray handle 140 in a locked position $T_1$. For example, the tray handle 140 may include a tray retaining mechanism 246 to engage with the lever member 242 in the locked position $T_1$.

The cable support member 180 is illustrated to include a rigid member 282 and a flexible member 284. The rigid member 282 and the flexible member 284 to move between a first position (FIG. 2) and a second position (FIG. 3) along a plane based on a force applied to move the tray 120 between a position in the rack and an extended position out of the rack. For example, the cable support member 180 may include a rigid member 282 formed of a cable guide or a cable frame to receive the cables that connect the tray 120 to an enclosure backplane, such as a rigid member 282 with two portions or sections, $M_1$ and $M_2$. The flexible member 284 is illustrated positioned between the two portions, $M_1$ and $M_2$. The flexible member 284 may include, for example, an elbow formed of bellows or a hinge connected to the two portions $M_1$ and $M_2$ with a hinge pin. The flexible member 284 to enable rotation of the two portions, $M_1$ and $M_2$. For example, the cable support member 180 may include an articulating arm with a hinge pin used to rotate the two portions $M_1$ and $M_2$.

The flexible'member 284 to bend as the tray 120 moves along the rail member 250. The rigid member 282 moves between a first or folded position $S_1$ and a second or extended position $S_2$ laterally along a plane. The movement of the rigid member 282 is controlled by the flexible member 284. The flexible member 284 provides a limited and structured movement to enable the rigid member 282 to move laterally along the plane and determine the amount of lateral movement therealong.

FIG. 4 illustrates a portion of the module 100 with the handle mechanism 130 in a bottom open position $C_2$ to provide access to the cage 125 via the bottom of the tray 120. The tray 120 illustrated includes perimeter walls 222 similar to those illustrated in FIGS. 2-3 and may further include at least one support wall 422 extending between the set of perimeter walls 222. The handle mechanism 130 includes a cage lever 132 and a cam member 134. The cage lever 132 may include a pair of levers 431 and a bar 432 between the pair of levers 431. Each lever of the pair of levers 431 is connected to the bar 432 at one end and is connected to the cage 125 at an opposite end. Each lever may extend from the opposite end. The levers 431 may engage the top cam surface 433 and the bottom cam surface 435. The handle mechanism 130 in the examples include two handles, one for top access and one for bottom access; however, a single handle may also be used. The single handle would have the ability to open towards the top and the bottom similar to the two separate handles illustrated herein.

The module 100 is further illustrated to include a cage retaining mechanism 229, such as a latch that holds the cage lever 132 in the closed position. For example, the latch may include a top latch 229A and/or a bottom latch 229B. FIG. 4 illustrates, the movement to the handle mechanism 130 between the closed position $C_0$ and the bottom open position $C_2$. The movement includes the cage lever 132 rotating the first amount $R_1$ to the bottom open position $C_2$. As the cage lever 132 rotates, it engages with a bottom cam surface 435. Rotation of the cage lever 130 rotates the cage 125 the second amount $R_2$. The cam member 134 to control a rate of rotation of the cage lever 132 and the cage 125. The cam member 134 is used to rotate the first amount $R_1$ along a first plane and the second amount $R_2$ along a second plane, where the first amount $R_1$ and the second amount $R_2$ are distinct. For example, the first amount $R_1$ may be ninety degrees and the second amount $R_2$ may be ten degrees.

In the bottom open position $C_2$ the electronic component 410 is accessible for repair or replacement. Once access to the electronic component 410 is not desired, the cage lever 132 may be rotated from the bottom open position $C_2$ to the closed position $C_0$. In the closed position $C_0$ the bottom latch 229B engages with the handle mechanism 130 to lock the cage lever 132. In the closed position $C_0$ or in a position where there is no access to the electronic components 410, the electronic components 410 may be inserted into a rack for use.

The movement of the handle mechanism 130 between the bottom open position $C_2$ and the top open position $C_1$ may be symmetrical. As such, the in the top open position $C_1$, the handle rotates a first amount $R_1$ and engages with a top cam surface 433. Rotation of the cage lever 132 rotates the cage 125 a second amount $R_2$. The cam member 134 controls the rate of rotation. Additional features, such as a stop for the lever may also be used to control movement of the handle mechanism 130 and/or cage 125.

Figure 5:
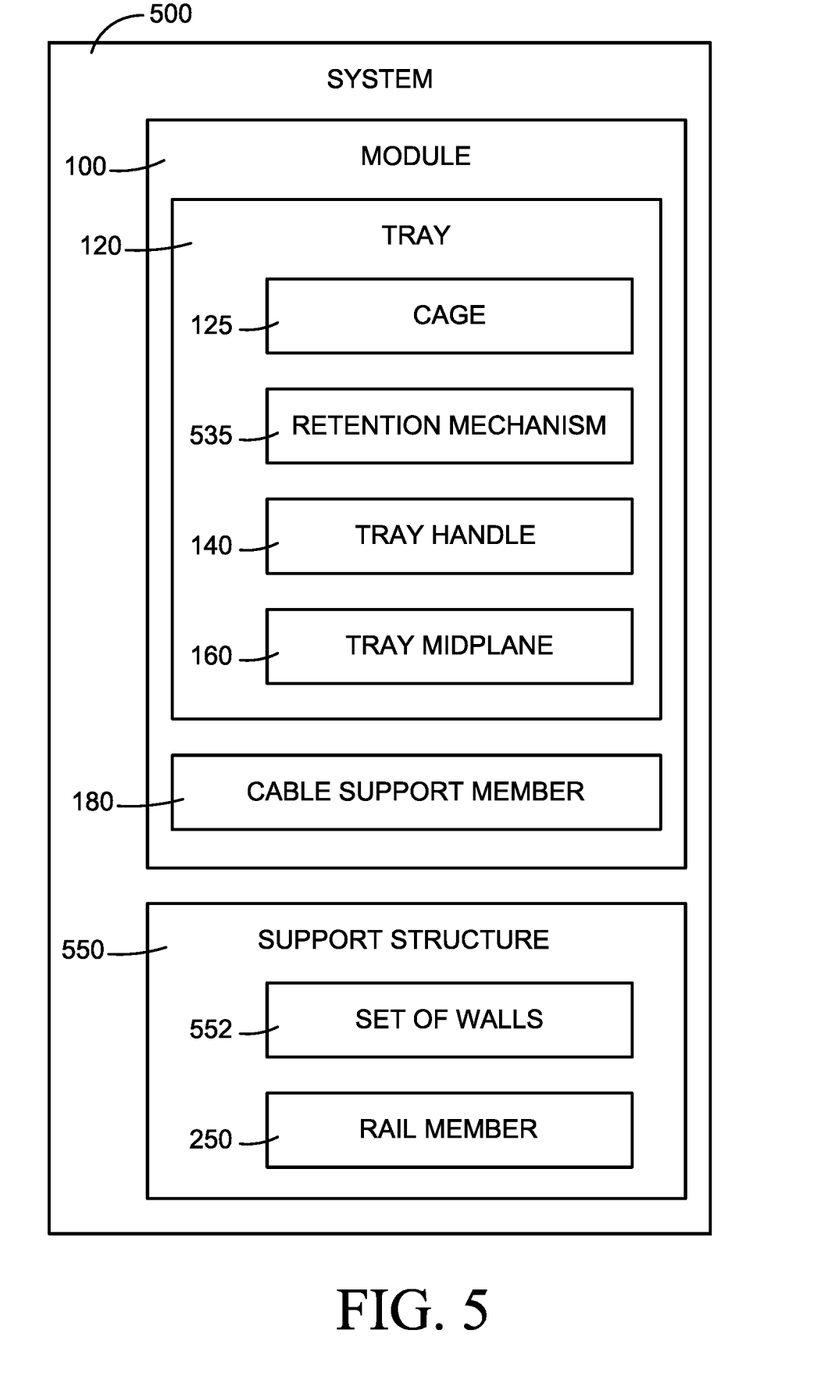
FIG. 5 illustrates a block diagram of a system according to an example.

FIG. 5 illustrates a block diagram of a system 500 according to an example. The system 500 includes a module 100 and a support structure 550. The module 100 includes a tray 120 and a cable support member 180. The tray 120 includes a cage 125, a tray handle 140, a tray midplane 160, and a retention mechanism 535. The cage 125 to hold an electronic component, and the retention mechanism 535 to control movement of the cage 125 between a closed position, top open position, and a bottom open position. The tray handle 140 connects to the tray 120 to release the tray 120 from an engaged position. The tray midplane 160 to provide a connector for the electronic component 410. The cable support member 180 to provide a movable connection between the tray midplane 160 and an enclosure backplane.

The support structure 550 includes a set of walls 552 and a rail member 250. For example, the support structure 550 may be a datacenter rack. The set of walls 552 to receive the module 100. The rail member 250 to attach to the tray 120 and support structure 550 to provide a connection therebetween. The rail member 250 may be used to slide the tray 120 into and out of the support structure 550.

Figure 6:
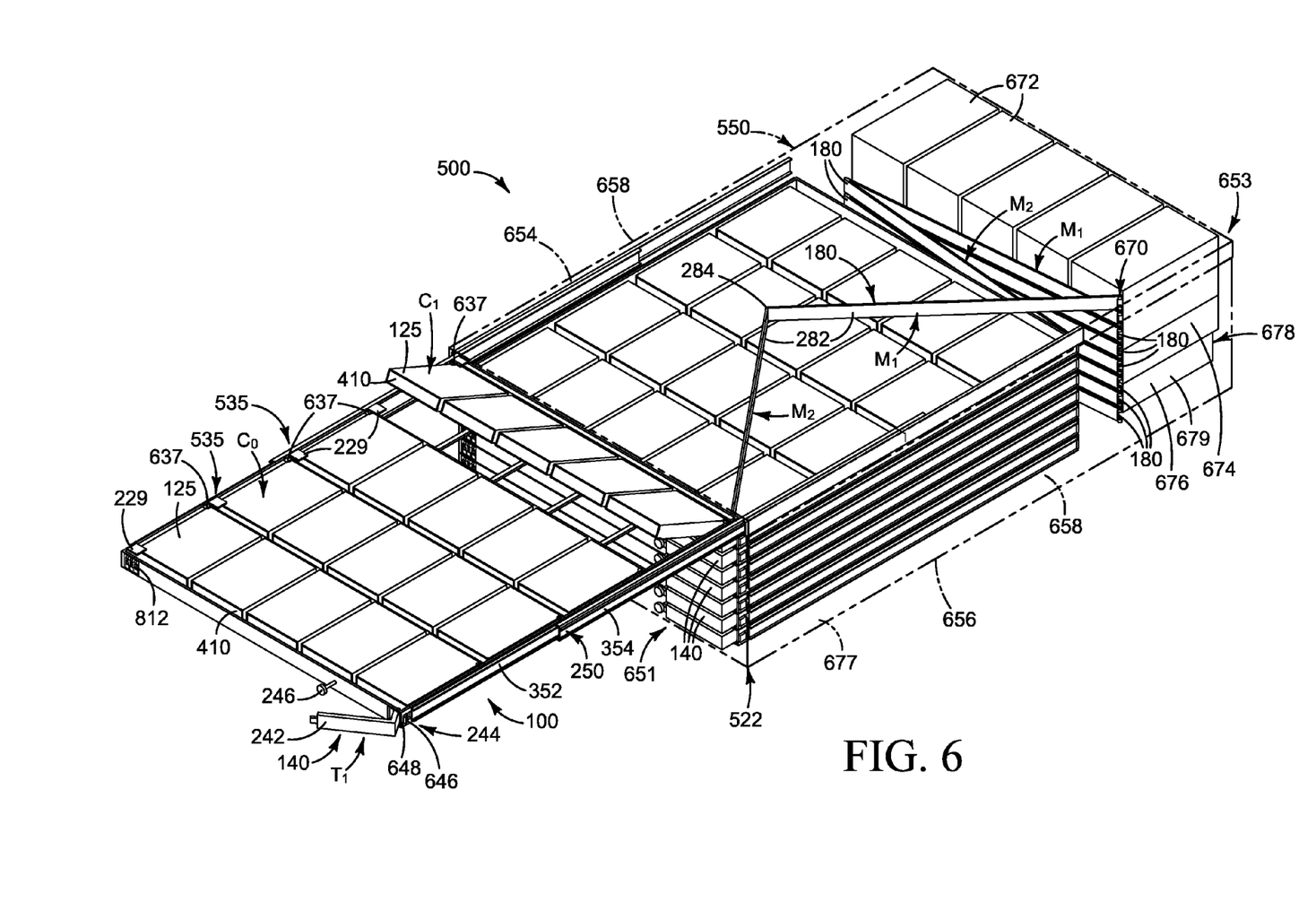
FIG. 6 illustrates a transparent view of the system of FIG. 5 according to an example.
Figure 7:
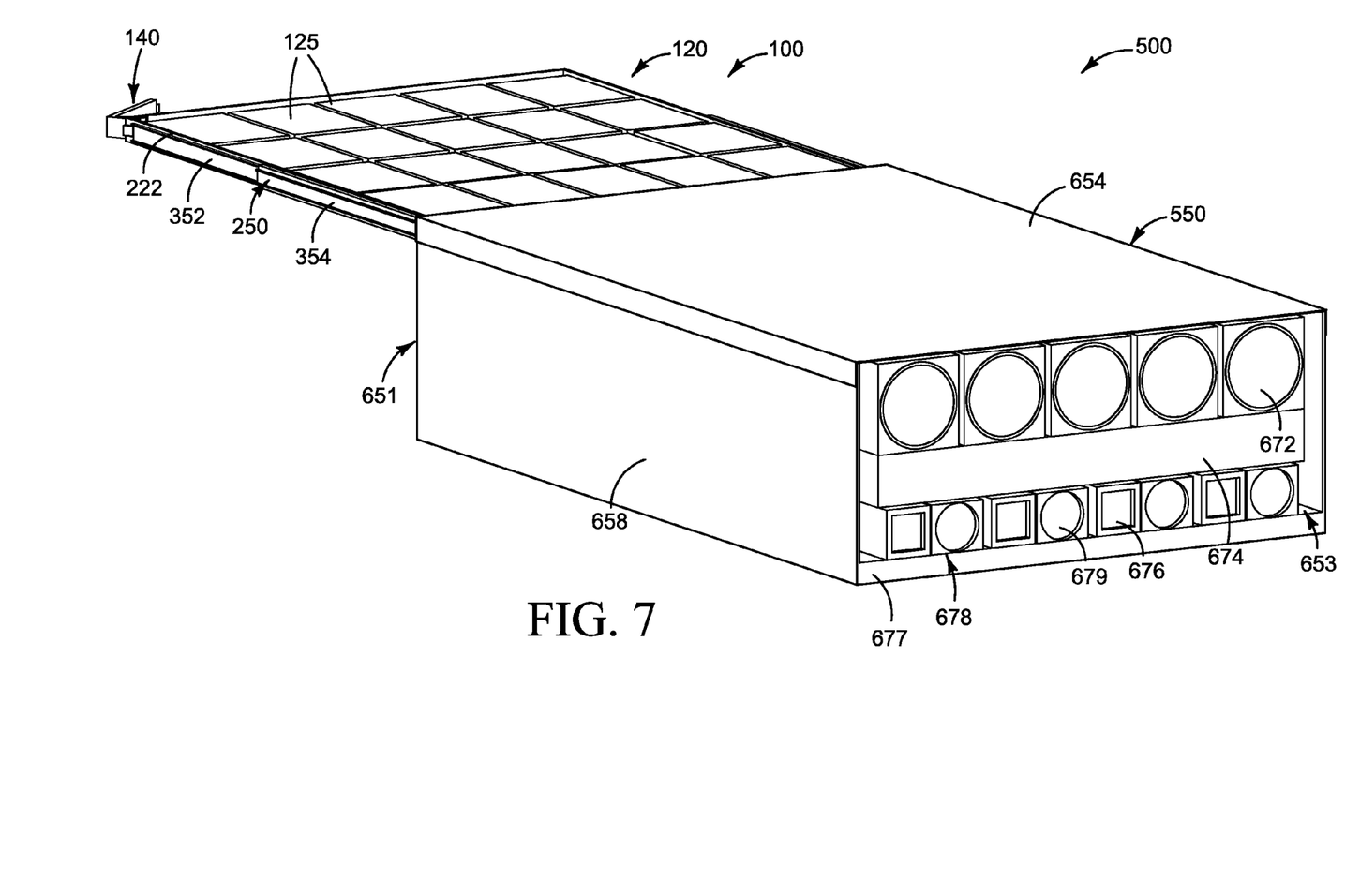
FIGS. 7-8 illustrate perspective views of the system of FIG. 5 according to examples.
Figure 8:
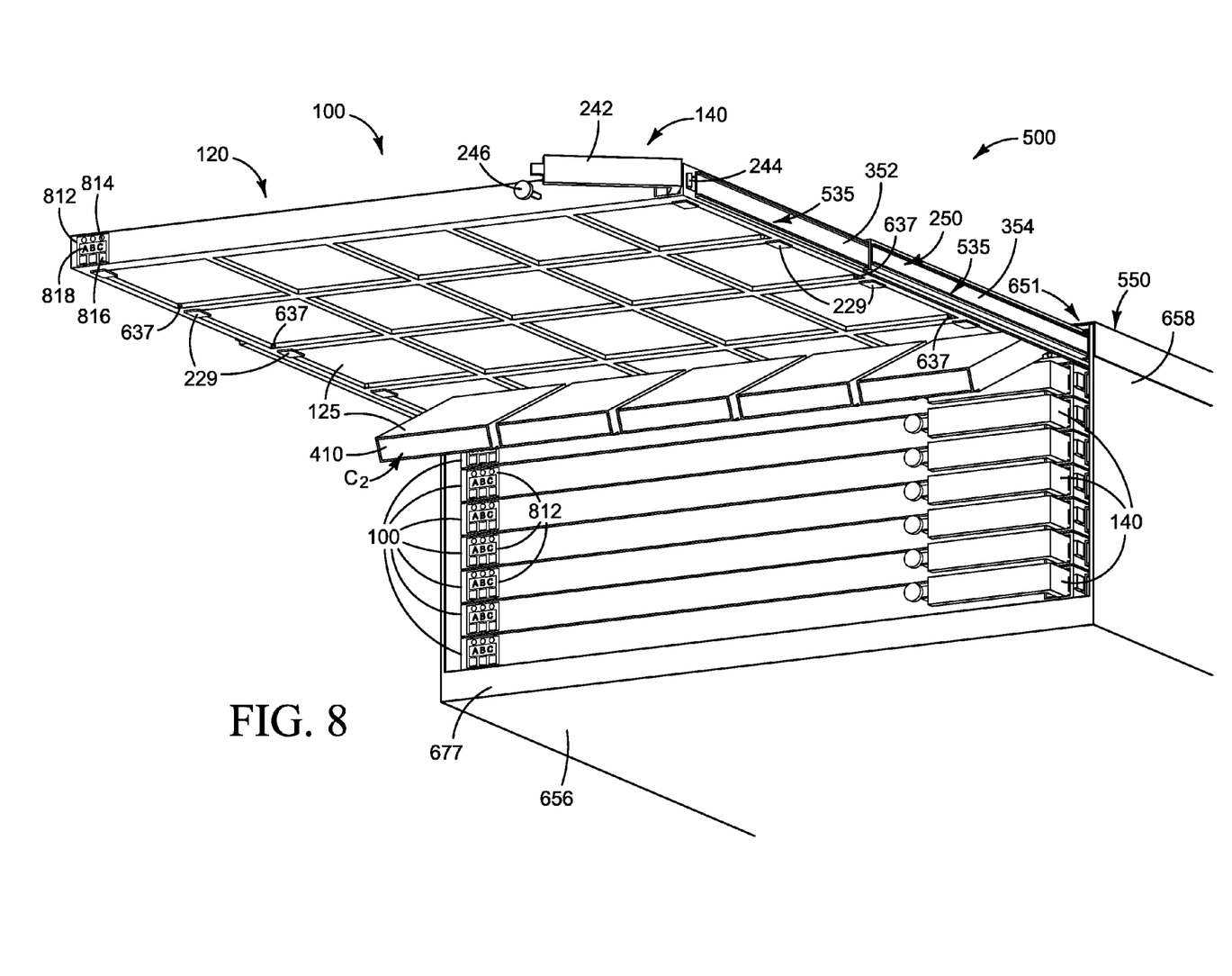

FIG. 6 illustrates a transparent view of the system 500 of FIG. 5 according to an example. FIGS. 7-8 illustrate perspective views of the system of FIG. 5 according to examples. The system 500 illustrated includes the module 100 and the support structure 550. The module 100 illustrated includes a tray 120, a tray handle 140, a tray midplane 160, and a cable support member 180. The support structure 550 is illustrated as an enclosure that receives the module 100. For example, the support structure 550 may hold trays 120 of electronic components 410, such as hot-pluggable hard disk drives; however, other electronic components may be included, such as modular servers or data storage devices.

The support structure 550 includes a set of walls 552, such as perimeter walls. For example, the support structure 550 is illustrated in FIGS. 7-8 to include a top wall 654, a bottom wall 656, and a pair of side walls 658 therebetween. The support structure 550 may alternatively include four support structures or columns including the rail member 250 mounted thereon to receive the tray 120.

The support structure 550 includes a front aperture 651 to access the trays 120 and a back aperture 653 to connect, for example, an enclosure backplane, circuitry, power supplies, cooling modules, and/or control modules. The back aperture 653 is illustrated on an opposite side of the support structure 550. The back aperture 653 to receive the enclosure backplane 670, a set of fans 672, a control device 674, and/or a power source 676.

For example, the front aperture 651 is illustrated to receive the tray 120. The tray 120 illustrated includes four rows of five cages 125, i.e., a 4U tray. Each cage 125 may include a slot 227 that receives the electronic components 410. Seven trays 120 are illustrated in the systems of FIGS. 6-8 with each tray 120 stacked in the support structure 550 in a vertical manner in relation to one another. The tray 120 may include a cage 125 and a retention mechanism 535. The retention mechanism 535 is connected to the cage 125 to control access to the cage 125.

Referring to FIG. 6, the retention mechanism 535 may include a spring loaded mechanism 637 and a retaining cage mechanism 229. The spring loaded mechanism 637, such as a compression or coil spring, to control movement of the cage 125 to an open position. The latch or a retaining cage mechanism 229 may engage with the cage 125 to hold to the cage 125 in the closed position $C_0$. Moreover, the latch or cage retaining mechanism 229 when released enables the spring loaded mechanism 637 to move the cage 125 between the closed position $C_0$ and the top open position $C_1$ illustrated in FIG. 6 and/or the bottom open position $C_2$, as further illustrated in FIG. 8.

For example, in the closed position $C_0$ a cage retaining mechanism 229 may hold the cage 125 in place. When the cage retaining mechanism 229 is not engaged with the cage 125 or a portion thereof, the cage 125 rotates the second amount $R_2$, i.e., ten degrees, to provide access to the cage slot 227 and/or electronic components 410 therein. The direction of the rotation of the cage 125 is determined by the cage retaining mechanism 229. For example, if the cage retaining mechanism 229 includes a top latch 229A and a bottom latch 229B, the cage 125 would rotate $R_2$ to the top open position $C_1$ when the top latch 229A is released and to the bottom open position $C_2$ when the bottom latch 229B is released.

Moreover, the retention mechanism 535 may alternatively include a cage lever 132 that rotates a first amount $R_1$, i.e., ninety degrees, to the top open position $C_1$, as illustrated in above in FIG. 3. Rotation of the cage lever 132 rotates the cage 125 a second amount $R_2$, i.e., ten degrees, to provide access to the cage 125 and/or electronic components 410 therein. As described in FIG. 3, the example that includes a cage lever 132 may also include a cam member 134 to rotate the first amount $R_1$ along a first plane and the second amount $R_2$ along a second plane such that the first amount $R_1$ and the second amount $R_2$ are distinct. The cage lever 132 may extend across one cage 125 to access each cage 125 individually, as FIG. 6 illustrates each cage 125 rotating to the open position separated. Alternatively, the cage lever 132 may extend across a plurality of cages 125, as illustrated in FIGS. 2-3. The configuration may depend on the configuration of the tray 120 and/or electronic components.

Each tray 120 may include the tray handle 140 at the front of the tray 120. The tray handle 140 may be aligned with the enclosure opening 651 and a rail member 250. For example, the tray handle 140 may include a lever member 242 that moves between a locked position $T_0$ and unlocked position $T_1$ using a fulcrum 648 and an engagement member 244, such as a hook 646, that moves into and out of engagement with a support structure 550 based on the movement of the lever member 242. As such, the engagement member 244 will engage with the support structure 550 to hold the tray 120 in a closed or locked position with the tray 120 and electronic components 410 contained in the support structure 550. The engagement member 244 will disengage or release the engagement with the support structure 550 to allow the tray 120 to move out of the support structure 550 to enable access to the cages 125 that hold the electronic components 410.

The rail member 250 may control the movement of the tray 120 after the tray handle 140 is disengaged. For example, the rail member 250 may include a set of ball bearing rails connected to one another and to slide thereon. The rails are connected to the tray 120 and the support structure 550. As the tray 120 moves along the rail member 250, the cable support member 180 also moves.

The cable support member 180 is illustrated to include a rigid member 282 and a flexible member 284. The rigid member 282 and the flexible member 284 to move between a first position $S_1$ and a second position $S_2$ along a plane when a force is applied. For example, a force applied to the tray 120 to move the tray 120 between a locked position in the support structure 550 and an extended position with the tray removed extending from the support structure 550. For example, the cable support member 180 may include a rigid member 282 formed of sheet metal that forms a cable guide or a cable frame to receive the cables that connect the tray 120 to the rest of the system 500. The rigid member 282 may include two portions or sections, $M_1$ and $M_2$. The flexible member 284 is illustrated positioned between the two portions, $M_1$ and $M_2$. The flexible member 284 may include, for example, an elbow formed of bellows or a hinge connected to the two portions $M_1$ and $M_2$ with a hinge pin. The flexible member 284 to enable rotation of the two portions $M_1$ and $M_2$. For example, the cable support member 180 may include an articulating arm with a hinge pin used to rotate the two portions $M_1$ and $M_2$.

The flexible member 284 to bend as the tray 120 moves along the rail member 250. The rigid member 282 moves between a first or folded position $S_1$ and a second or extended position $S_2$ laterally along a plane. The movement of the rigid member 282 is controlled by the flexible member 284. The flexible member 284 provides a limited and structured movement to enable the rigid member 282 to move laterally along the plane and determine the amount of lateral movement therealong.

FIG. 6 illustrates the cable support member 180 connected to the top or first tray 620 in the system 500 in the extended position $S_2$. The remaining trays, i.e., the second through seventh tray in the support structure 550, include the cable support member 180 connected in the folded position S₁, having a slim profile within the support structure 550. The cable support member 180 is illustrated with one portion M₂ of the rigid member 282 connected to one side of the tray 120 to route the cable along the tray 120 and to the tray midplanes 160 and cages 125 on the tray 120. The other portion M₁ of the rigid member 282 connected to the side wall 658 of the support structure 550 to route the cable to the enclosure backplane 670. Alternatively, the other portion M₁ of the rigid member 282 may be directly connected to the enclosure backplane 670. The cable support member 180 provides the connections necessary for the electronic components 410 to operate, a structured movement that does not interfere with the movement of the tray 120, and protection for the cables during use.

The system 500 may further include an enclosure cooling mechanism 678 to remove heat from the support structure 550. For example, the enclosure cooling mechanism 678 may include a cooling channel 677 or air passage formed of sheet metal that forms a gap or channel along a bottom portion of the support structure 550. The cooling channel 677 may extend along the length of the support structure 550 or a portion of the length and provide an area for heat to dissipate from the system 550. Moreover, the enclosure cooling mechanism 678 may include fans 679 or other cooling devices to remove heat from the support structure 550.

FIG. 7 illustrates a back view of the system 500 of FIG. 5 according to an example. The back view illustrates the back of the support structure 550 with the top wall 654, side wall 658, and back aperture 653 illustrated. The back aperture 653 is positioned opposite the front aperture 651 in the support structure 550. The back aperture 653 receives the set of fans 672, the control device 674, and the power source 676, which may each be connected to the enclosure backplane 670. The enclosure backplane 670 provides a connection and transfer of signals within the support structure 550 and between the enclosure backplane 670 and electronic components 410 via the tray midplanes 160 and cable support member 180.

The set of fans 672 are illustrated as five fans across the back aperture 653 to remove heat from the electronic components 410. The set of fan 672 are illustrated along a top portion of the support structure 550. Other cooling devices, such as a liquid cooling and/or dry disconnect cooling device may replace the fans and/or be used in combination with fans 672. The control device 674 to control the electronic components 410, the set of fans 672, the power source 676, and/or the enclosure cooling mechanism 678. The control device 674 may be connected to the enclosure backplane 670 and connectable to the module 100 via the cables that are carried to the trays 120 through the cable support member 180. Further cabling may be used within the support structure 550 to connect the enclosure backplane 670, the set of fans 672, the control device 674, the power source 676, and/or the enclosure cooling mechanism 678. The power source 676 to supply power to the system 500.

Referring to FIG. 8, a bottom perspective view of the system 500 is illustrated. The system 500 illustrated includes the modules 100 and the support structure 550. The system 500 is illustrated with one of the trays 120 pulled out of the support structure 550 and a row of cages 125 rotated downward to access the cage 125 and/or the electronic components 410 therein.

The modules 100 are illustrated similar to those described above with reference to FIGS. 1-6. One tray 120 is extending from the front aperture 651 of the support structure 550 and a cage 125 is illustrated in a bottom open position C₂. The retention mechanism 535 may include a features of the handle mechanism 130 as illustrated in FIGS. 1-4 and/or a spring loaded cage that may be accessed using a spring loaded mechanism 637 as illustrated in FIGS. 5-6.

The system 500 further includes a display module 812 to provide visual information regarding the electronic components 410. For example, the display module 812 may include an LED (light-emitting diode) display that identifies electronic components 410, provides a status of the electronic components 410, warnings and/or error messages. The display module 812 may include colored lights 814, icons 816 representing the trays, words 818, and/or a combination thereof.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:
1. A module comprising:
    a tray including:
        a cage to receive an electronic component,
        a handle mechanism to rotate the cage, the handle mechanism including:
            a cage lever to rotate between a closed position, a top open position, and a bottom open position and
            a cam member to control a rate of rotation of the cage lever and the cage,
        a tray handle connected to the tray to release the tray from an engaged position, and
        a tray midplane to provide a connector for the electronic component; and
    a cable support member to provide a movable connection between the tray midplane and an enclosure backplane.
2. The module of claim 1, wherein in the closed position, a top latch and a bottom latch holds the handle mechanism in the closed position.
3. The module of claim 1, wherein in the top open position the cage lever rotates a first amount to the top open position, rotation of the cage lever to rotate the cage a second amount to provide access to the cage.
4. The module of claim 1, wherein in the bottom open position, the cage lever rotates a first amount to the bottom open position, rotation of the cage lever to rotate the cage a second amount to provide access to the cage.

5. The module of claim 1, wherein the tray midplane comprises a dual Serial Attached SCSI port.

6. The module of claim 1, wherein the cable support member comprises a rigid member and a flexible member, the rigid member and the flexible member to move between a first position and a second position along a plane based on a force applied to the cable support member.

7. A system comprising:
a module including:
  a tray including:
    a cage to hold an electronic component,
    a retention mechanism to control movement of the cage between a closed position, a top open position, and a bottom open position,
    a tray handle connected to the tray to release the tray from an engaged position,
    a tray midplane to provide a connector for the electronic component; and
  a cable support member to provide a movable connection between the tray midplane and an enclosure backplane; and
a support structure including:
  a set of walls to receive the module, and
  a rail member to attach to the tray and the support structure to provide a connection therebetween, the rail member usable to slide the tray into and out of the support structure.

8. The system of claim 7, further comprising a set of fans to cool the electronic component.

9. The system of claim 7, further comprising a power source to provide power to the module.

10. The system of claim 7, further comprising an enclosure cooling mechanism to remove heat from the support structure.

11. The system of claim 7, further comprising a control device to control the electronic component.

12. The system of claim 7, further comprising a display module to provide visual information regarding the system.

13. The system of claim 7, wherein the support structure includes a top wall, a bottom wall, and a pair of side walls therebetween.

14. The system of claim 7, wherein the retention mechanism comprises a spring loaded mechanism and a retaining cage mechanism to control rotation of the cage.

15. The system of claim 7, wherein the cable support member comprises a rigid member and a flexible member, the rigid member and the flexible member to move between a first position and a second position along a plane based on movement of the tray along the rail member.

* * * * *